United States Patent
Smith et al.

(10) Patent No.: US 7,740,815 B2
(45) Date of Patent: Jun. 22, 2010

(54) METHOD OF TREATING A GAS STREAM

(75) Inventors: James Robert Smith, Taunton (GB); Gary Peter Knight, Bristol (GB)

(73) Assignee: Edwards Limited, Crawley, West Sussex (GB)

( * ) Notice: Subject to any disclaimer, the term of this patent is extended or adjusted under 35 U.S.C. 154(b) by 0 days.

(21) Appl. No.: 11/887,044

(22) PCT Filed: Mar. 13, 2006

(86) PCT No.: PCT/GB2006/000879

§ 371 (c)(1),
(2), (4) Date: Jan. 22, 2009

(87) PCT Pub. No.: WO2006/100432

PCT Pub. Date: Sep. 28, 2006

(65) Prior Publication Data

US 2009/0202411 A1 Aug. 13, 2009

(30) Foreign Application Priority Data

Mar. 22, 2005 (GB) .................. 0505852.4

(51) Int. Cl.
*B01D 53/46* (2006.01)
*B01D 53/68* (2006.01)
*B01D 53/74* (2006.01)

(52) U.S. Cl. ................ 423/210; 423/240 R; 423/245.1; 423/245.2; 422/168

(58) Field of Classification Search .................. 423/210, 423/240 R, 245.1, 245.2; 422/168

See application file for complete search history.

(56) References Cited

U.S. PATENT DOCUMENTS

| 5,405,445 A | 4/1995 | Kumada et al. |
| 5,769,626 A | 6/1998 | Hauff et al. |
| 6,084,148 A * | 7/2000 | Shiban et al. ............... 423/219 |
| 2004/0219085 A1 | 11/2004 | Ogawa |

FOREIGN PATENT DOCUMENTS

| EP | 0 580 158 B1 | 1/1994 |
| GB | 608237 | 9/1948 |

OTHER PUBLICATIONS

Shimada Masao; abstract of JP 01293120, "Treatment of Waste Gas," NEC Corporation; Nov. 27, 1989.
Hiai Atsuhiko, Wakimura Kazuo, Kitano Nobuhiro, Fujii Shigetaka; abstract of JP 61093310 A, "Disposal of Waste Gas," Mitsui Toatsu Chemicals; May 12, 1986.

(Continued)

*Primary Examiner*—Timothy C Vanoy
(74) *Attorney, Agent, or Firm*—Mary K. Nicholes; Ting-Mao Chao

(57) ABSTRACT

A method of treating a gas stream containing silane or other silicon-containing gas is described, in which the gas stream is conveyed to a liquid ring pump or screw-mechanism pump, to which are also supplied an oxidant for oxidising the silicon-containing gas within the pump, and a liquid for forming a liquid ring or intermittent flushing within the pump. A liquid stream containing said liquid and a by-product of the oxidation of the silicon-containing gas is exhaust from the pump.

33 Claims, 3 Drawing Sheets

OTHER PUBLICATIONS

Takemori Toshinori, Yamada Yasuo, Kumagai Yasuo, Matsumoto Norikazu; abstract of JP 1266836 A, "Method for Removing Arsine and/or Phosphine," Kyowa Kako, Furukawa Co Ltd; Oct. 24, 1989.

Takamatsu Kenichi, Nishiyama Tadashi, Iwamoto Masaya; abstract of JP 4310215 A, "Exhaust Gas Treating Device," OKI ENG KK; Nov. 2, 1992.

United Kingdom Search Report of Application No. GB 0505852.4; Claims searched: 1-25; Date of search: Jul. 20, 2005.

PCT Notification of Transmittal of the International Search Report and the Written Opinion of the International Searching Authority, or the Declaration of International Application No. PCT/GB2006/000879; Date of mailing: Jun. 6, 2006.

PCT International Search Report of International Application No. PCT/GB2006/000879; Date of mailing of the International Search Report: Jun. 6, 2006.

PCT Written Opinion of the International Searching Authority of International Application No. PCT/GB2006/000879; Date of mailing: Jun. 6, 2006.

* cited by examiner

METHOD OF TREATING A GAS STREAM

FIELD OF THE INVENTION

The present invention relates to a method of, and apparatus for, treating a gas stream, and in particular to the treatment of a gas stream containing a silicon-containing gas, for example a pyrophoric gas such as silane.

BACKGROUND OF THE INVENTION

The use of pyrophoric gases to deposit process layers on to silicon wafers or flat panel displays is well known. Such gases include silane, disilane, dichlorosilane and trichlorosilane. Pyrophoric gases can pose a risk in that they may cause a spontaneous and uncontrolled pyrophoric reaction on contact with air. In order to minimize the risk of an uncontrolled pyrophoric reaction due to the presence of pyrophoric gases within the waste stream exhaust from the process tool, it is known to employ a "burn box" or "burn tube" to remove the pyrophoric gases to a concentration below flammable limits by causing the pyrophoric gas to react with air. Such burn tube devices generally include a reaction chamber having inlets for receiving the pyrophoric gas-containing stream and a stream of air for producing a controlled and contained pyrophoric reaction within the chamber, and an exhaust duct of conveying the waste stream from the chamber.

When silane, for example burns, large amounts of silica powder are formed, which can rapidly block the reaction chamber, inlets and downstream duct. As a result, regular cleaning of the device is required, which can increase costs and incur downtime of the process tool. In addition, if a fault occurs, the temperature in the device can rapidly rise, posing a potential fire hazard. Furthermore, it has become common practice to dilute the silane bearing gas stream with a diluent gas, typically nitrogen, to a level at which it is not flammable in or immediately behind a pumping mechanism for drawing the waste stream from a process chamber (a level of below 1% is often recommended). Such dilution renders the subsequent use of burn tubes ineffective.

It is an aim of at least the preferred embodiment of the present invention to seek to solve these and other problems.

SUMMARY OF THE INVENTION

In a first aspect, the present invention provides a method of treating a gas stream containing a silicon-containing gas, the method comprising the steps of conveying the gas stream to a pump, supplying to the pump an oxidant for oxidising the silicon-containing gas within the pump and a liquid; and exhausting from the pump said liquid containing a by-product of the oxidation of the silicon-containing gas.

In a third aspect the present invention provides apparatus for treating a gas stream containing a silicon-containing gas, the apparatus comprising a pump for receiving the gas stream, means for supplying to the pump an oxidant for oxidising the silicon-containing gas within the pump, and a liquid; and means for conveying from the pump liquid containing a by-product of oxidation of the silicon-containing gas within the pump.

BRIEF DESCRIPTION OF THE DRAWINGS

Preferred features of the present invention will now be described with reference to the accompanying drawings, in which.

DETAILED DESCRIPTION OF THE INVENTION

Figure 1:
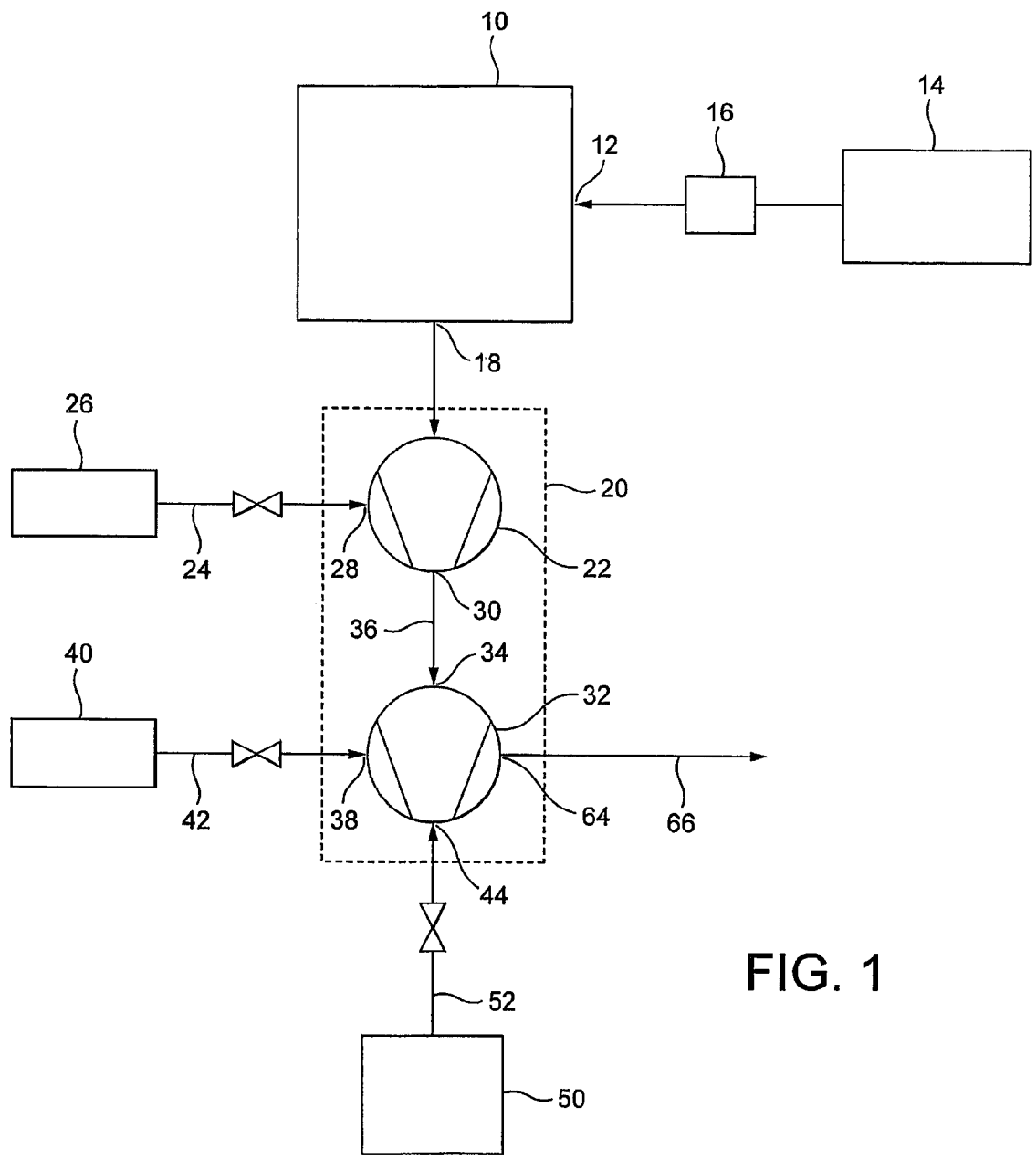
FIG. 1 illustrates schematically a system for evacuating a process chamber.

In one embodiment, the pump comprises a liquid ring pump. A liquid ring pump comprises a rotor rotatably mounted in an annular housing such that the rotor axis is eccentric to the central axis of the housing. The rotor has blades that extend radially outwardly therefrom and are equally spaced around the rotor. A quantity of a pumping liquid such as water is maintained in the housing. As the rotor rotates, the rotor blades engage the liquid and form it into an annular ring inside the housing. This means that on an inlet side of the pump the gas present in the compression regions located between adjacent rotor blades is moving radially outward, away from the rotor hub, while on the outlet side of the pump the gas is moving radially inward toward the rotor hub. This results in a piston-type pumping action on the gas passing through the pump.

In this preferred embodiment, a first gas inlet is provided at the inlet side of the pump so that the gas stream containing the silicon-containing gas, for example silane, is pulled into the spaces between adjacent rotor blades where the liquid is moving radially outward. A second gas inlet is also provided at the inlet side of the pump for conveying a second gas stream such as air or other oxygen-containing gas to the housing. A further inlet for conveying to the housing liquid for forming the liquid ring within the housing is typically provided at the bottom of the housing, between the inlet and outlet sides of the pump.

Within the housing, a gas phase oxidation of the silane takes place. For example, when the oxidant is oxygen, the oxidation forms silica ($SiO_2$), which becomes entrained within the liquid ring. An outlet is provided at the outlet side so that a liquid stream containing the liquid and this solid by-product from the reaction together with any other components of the first and second gas streams entering the pump can be discharged from the pump.

In another embodiment, the pump comprises a screw pumping mechanism, preferably a multi-rotor screw mechanism. Multi-rotor screw-mechanism pumps are capable of pumping mixtures of gas and liquid, and can thus be used as an alternative to a liquid ring pump for the present invention. Multi-rotor screw pumping mechanisms comprise of two or more rotating screws within a stationary stator, in which fluid is transported axially in the cavities formed by the meshing teeth of the screw rotors. The direction of fluid movement through the mechanism is dependent upon the direction of rotation of the screw rotors. Compression is provided, not within the pump itself but by the restriction to the outlet, which is often simply atmospheric pressure.

In this embodiment a primary gas inlet is provided at the inlet end of the pump so the gas stream containing the silicon-containing gas is drawn into the pump. A second gas inlet further along the rotors allows the introduction of the second gas stream containing the oxidising agent (such as oxygen, ozone, a peroxide, air or a halogenated species). A third inlet provides for the introduction of a liquid stream, which may be introduced continuously or intermittently.

At and downstream from the second gas inlet, the two gas streams mix within the pump housing and gas phase oxidation of the silicon-containing gas takes place. Similar to the liquid ring pump, the solid oxidation by-products (for example, $SiO_2$ in the case of silane oxidation) are entrained by the liquid stream. The pump outlet allows for the discharge of the liquid stream from the pump.

The liquid ring pump or screw-mechanism pump thus operates both as an abatement device for the silicon-containing gas and as an atmospheric vacuum pumping stage for the first gas stream. With regard to the abatement aspect of the liquid ring pump or screw-mechanism pump, the reduced pressure within the pump provides a safe environment for the oxidation of gases. Heat generated during the oxidation is transferred to the liquid within the pump. Thus, during use, relatively hot liquid is exhaust from the pump, and is replaced by relatively cold liquid entering the pump. This can prevent excessive temperature rises within the pump. In addition, as any solid by-products from the oxidation are removed from the pump with the liquid, there is no clogging of the pump or the outlet therefrom, and so there is no need to provide any separate arrangement for removing these solid by-products from the pump. Furthermore, where the liquid within the pump is water or other aqueous solution, water vapour and spray from the liquid can generate a moist atmosphere within the pump. This has been found to be beneficial in promoting the oxidation of a silicon-containing gas such as silane. Additionally, no dilution of the silane-containing stream is required, saving great costs.

With regard to the pumping aspect of the liquid ring pump or screw-mechanism pump, unlike a Roots or Northey-type pumping mechanism that may be used as an atmospheric pressure pumping stage, any particulate or powder by-products from the abatement of the silicon-containing gas do not have a detrimental effect on the mechanism of the pump.

In the preferred embodiment, the silicon-containing gas is a precursor used in the manufacture of a semiconductor device. Examples of such silicon-containing gases include silane, disilane, dichlorosilane, trichlorosilane, tetraethylorthosilicate (TEOS), a siloxane, such as octamethylcyclotetrasiloxane (OMCTS) an organosilane. The silicon-containing gas may be pyrophoric, and so in a second aspect the present invention provides a method of treating a gas stream containing a pyrophoric gas, the method comprising the steps of conveying the gas stream to a pump, supplying to the pump an oxidant for oxidising the pyrophoric gas within the pump and a liquid; and exhausting from the pump said liquid containing a by-product of the oxidation of the pyrophoric gas In addition to silicon-containing gases, other pyrophoric gases that may be treated in this manner include metallic and other non-metallic hydrides, such as diborane and phosphine. In addition to an oxygen stream, the second gas stream may comprise air. Other suitable oxidants include halogens, such as chlorine and bromine, NO, ozone and a peroxide.

In a another aspect, the present invention provides apparatus for treating a gas stream containing a pyrophoric gas, the apparatus comprising a pump for receiving the gas stream, means for supplying to the pump an oxidant for oxidising the pyrophoric gas within the pump, and a liquid; and means for conveying from the pump liquid containing a by-product of oxidation of the pyrophoric gas within the pump.

In a another aspect, the present invention provides a system for evacuating a process chamber, the system comprising a vacuum pump for drawing a gas stream from the chamber, and apparatus as aforementioned for receiving the gas stream from the vacuum pump.

Features described above in relation to the method aspect of the invention are equally applicable to apparatus and system aspects, and vice versa.

While the foregoing description and drawings represent the preferred embodiments of the present invention, it will be apparent to those skilled in the art that various changes and modifications may be made therein without departing from the true spirit and scope of the present invention.

With reference first to FIG. 1, a process chamber 10 is provided with at least one inlet 12 for receiving one or more process gases from gas sources indicated generally at 14 in FIG. 1. The process chamber 10 may be a chamber within which the processing of semiconductors or flat panel display devices takes place. A mass flow controller 16 may be provided for each respective process gas, the mass flow controllers being controlled by a system controller to ensure that the required amount of gas is supplied to the process chamber 10.

A waste gas stream is drawn from the outlet 18 of the process chamber 10 by a pumping system indicated at 20 in FIG. 1. During the processing conducted within the chamber 10, only a portion of the process gases supplied to the chamber will be consumed, and so the waste gas stream exhaust from the outlet 18 of the process chamber 10 will contain a mixture of the process gases supplied to the chamber 10, and by-products from the process conducted within the chamber 10.

The pumping system 20 comprises at least one secondary pump 22 (one shown in FIG. 1, although any suitable number may be provided depending on the capacity of the process chamber 10). Each secondary pump 22 may comprise a multi-stage dry pump, wherein each pumping stage may be provided by a Roots-type or Northey-type pumping mechanism, a turbomolecular pump, and/or a molecular drag mechanism, depending on the pumping requirements of the process chamber 10. To prevent the secondary pump(s) from becoming damaged during evacuation of the process chamber 10, as illustrated in FIG. 1 a purge gas such as nitrogen or helium, may be supplied to each secondary pump 22 via a conduit system 24 connecting a source 26 of the purge gas with a purge port 28 of each secondary pump 22.

The secondary pump(s) 22 draw the waste gas stream from the outlet 18 of the process chamber 10 and exhaust-the gas stream at a sub-atmospheric pressure, typically in the range from 50 to 500 mbar, from an exhaust 30 thereof. In view of this, the pumping system 20 includes a backing pump 32 having a first inlet 34 connected to the exhaust 30 of the secondary pump(s) 22 via a conduit system 36 for conveying the waste stream to the backing pump 32.

Depending on the process conducted within the process chamber 10, the waste stream entering the backing pump 32 may contain one or more silicon-containing gases used as a precursor in the manufacture of a semiconductor device. Examples of such gases include silane, disilane, dichlorosilane, trichlorosilane, tetraethylorthosilicate (TEOS), a siloxane, such as octamethylcyclotetrasiloxane (OMCTS) and an organosilane. Silane, for example, is typically used as a process gas in the deposition of polysilicon or silicon dioxide layers in a chemical vapour deposition (CVD) process. This gas may be pyrophoric.

In view of this, the backing pump 32 is configured to perform a controlled oxidation of the silicon-containing gas contained in the waste stream. Two embodiments of a suitable backing pump will now be described with reference to FIGS. 2 and 3. In the first embodiment, the backing pump is provided by a liquid ring pump, and in the second embodiment, the backing pump is provided by a pump having a screw-type pumping mechanism.

Figure 2:
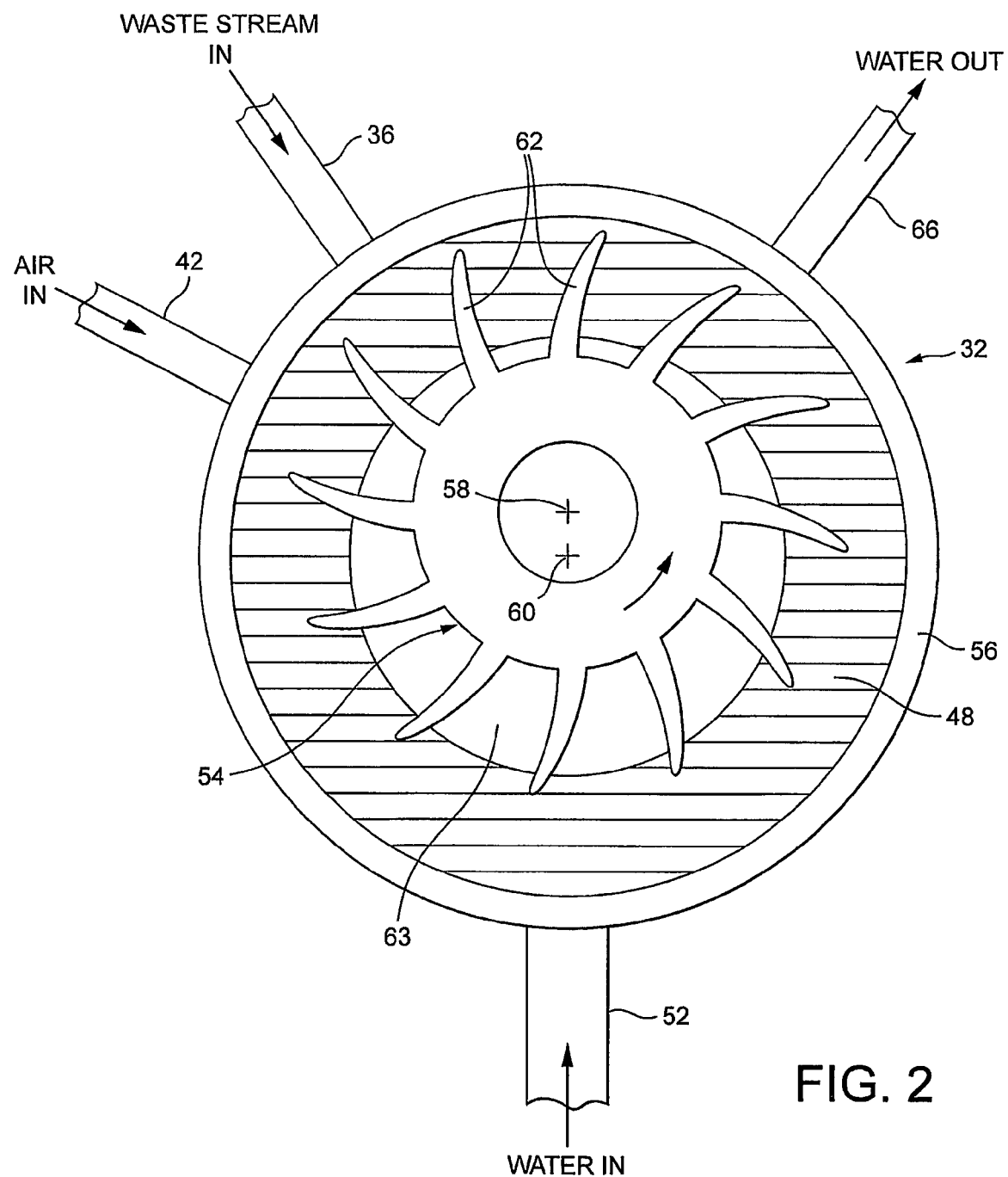
FIG. 2 illustrates schematically one embodiment of an apparatus for treating a gas stream drawn from the process chamber.

With reference first to FIG. 1, the liquid ring pump 32 includes a second inlet 38 located adjacent the first inlet 34 on the inlet side of the liquid ring pump 32, as shown in FIG. 2. A source 40 of an oxidant for oxidising any silicon-containing gases, in this example silane, within the waste stream is connected to the second inlet 38 of the liquid ring pump 32 by a conduit system 42, which supplies the oxidant to the liquid ring pump 32. The source 40 may conveniently comprise a source of air, containing oxygen for oxidising the silane. Other alternatives include ozone, NO, and a peroxide. The liquid ring pump 32 further includes a third inlet 44 through which liquid for forming a liquid ring 48 within the pump 32 is conveyed from a source 50 thereof via conduit system 52. In this embodiment, the liquid is water, although any other aqueous solution may be used.

As illustrated in FIG. 2, the liquid ring pump 32 comprises a rotor 54 rotatably mounted in an annular housing 56 such that the rotor axis 58 is eccentric to the central axis 60 of the housing 56. The rotor 54 has blades 62 that extend radially outwardly therefrom and are equally spaced around the rotor 54. With rotation of the rotor 54, the blades 62 engage the liquid and form it into an annular ring 48 inside the housing 56.

The waste stream entering the liquid ring pump 32 through the first inlet 34, and the air stream entering the liquid ring pump 32 through the second inlet 38, are pulled into the spaces 63 between adjacent blades 62. As a result, a gas phase oxidation of the silane contained within the waste stream takes place at a sub-atmospheric pressure within the liquid ring pump 32. For example, where the oxidant is oxygen, the reaction occurring within the liquid ring pump 32 forms silica ($SiO_2$), which becomes entrained within the liquid ring 48 formed within the liquid ring pump 32. The liquid ring pump 32 is provided with an exhaust 64 on the outlet side thereof for exhausting from the pump 32 a liquid stream containing liquid from the liquid ring 48 and the by-product from the oxidation of silane. As liquid is conveyed from the exhaust thereof by conduit system 66, the liquid ring 48 may be replenished by supplying fresh liquid to the housing 56 via third inlet 44. The liquid stream exhaust from the liquid ring pump 32 may be subsequently treated to remove the by-product therefrom. Following treatment, the treated liquid may be returned to source 50 for re-use.

The embodiment in which the backing pump 32 is provided with a screw-type pumping mechanism will now be described with reference to FIG. 3, in which equivalent features to those described above with reference to the liquid ring pump will be given the same reference numerals.

The first inlet 34 through which the waste stream enters the pump 32 is located at an inlet side of the pump. The second inlet 38 is located adjacent the first inlet 34 on the inlet side of the pump 32, as shown in FIG. 3. A source 40 of an oxidant for oxidising any silane within the waste stream is connected to the second inlet 38 of the pump 32 by a conduit system 42, which supplies the oxidant to the pump 32. As above, the source 40 may conveniently comprise a source of air, containing oxygen for oxidising the silane, or any other suitable oxidant may be used. The pump 32 further includes a third inlet 44 through which liquid for flushing the pump housing 70 within the pump 32 is conveyed from a source 50 thereof via conduit system 52. In this embodiment, the liquid is water, although any other aqueous solution may be used. The liquid may be supplied intermittently to the pump 32.

Figure 3:
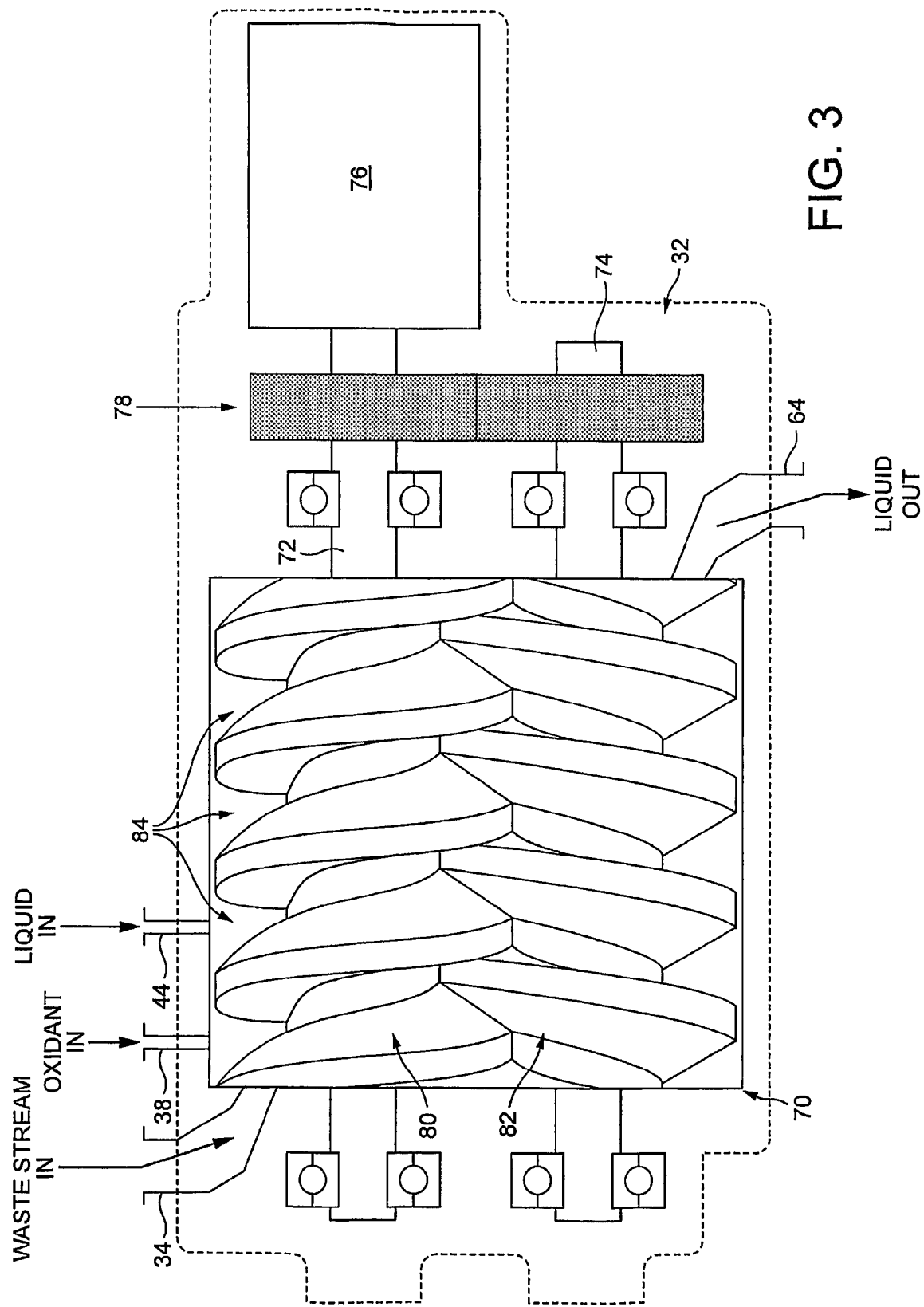
FIG. 3 illustrates schematically another embodiment of an apparatus for treating a gas stream drawn from the process chamber.

As illustrated in FIG. 3, the pump 32 includes a first shaft 72 and, spaced therefrom and parallel thereto, a second shaft 74. Bearings are provided for supporting the shafts 72, 74. The shafts 72, 74 are adapted for rotation within the housing 70 about the longitudinal axes in a contra-rotational direction. The first shaft 72 is connected to a drive motor 76, the shafts being coupled together by means of timing gears 78 so that in use the shafts 72, 74 rotate at the same speed but in opposite directions. A first rotor 80 is mounted on the first shaft 72 for rotary movement within the chamber 70, and a second rotor 82 is similarly mounted on the second shaft 74. Each of the two rotors 80, 82 are of generally cylindrical shape and has a helical vane or thread respectively formed on the outer surface thereof, the threads intermeshing as illustrated.

In use, the waste stream entering the screw-mechanism pump 32 through the first inlet 34, and the air stream entering the screw-mechanism pump 32 through the second inlet 38, are pulled into the cavities 82 between intermeshing rotors 80, 82. As a result, a gas phase oxidation of the silane contained within the waste stream takes place at a sub-atmospheric pressure within the screw-mechanism pump 32. For example, where the oxidant is oxygen, the reaction occurring within the screw-mechanism pump 68 forms silica ($SiO_2$), which becomes entrained within the liquid 74 that enters the screw-mechanism pump 32 via the third inlet 44, either intermittently or continuously. The screw-mechanism pump 32 is provided with an exhaust 64 on the outlet side thereof for exhausting from the pump 32 a liquid stream containing the liquid and the by-product from the oxidation of the silane. As liquid is conveyed from the exhaust thereof by conduit system 66, the flush liquid may be replenished by supplying fresh liquid to the housing 70 via third inlet 44. The liquid stream exhaust from the screw-mechanism pump 32 may be subsequently treated to remove the by-product therefrom. Following treatment, the treated liquid may be returned to source 50 for re-use.

We claim:

1. A method of treating a gas stream containing a silicon-containing gas, the method comprising the steps of:
   conveying the gas stream to a pump;
   supplying to the pump an oxidant for oxidising the silicon-containing gas within the pump and a liquid; and
   exhausting from the pump said liquid containing a by-product of the oxidation of the silicon-containing gas
   wherein the liquid comprises water or an aqueous solution.

2. The method according to claim 1 wherein the silicon-containing gas is a precursor used in the manufacture of a semiconductor device.

3. The method according to claim 1 wherein the silicon-containing gas is selected from the group consisting of silane, disilane, dichlorosilane, trichlorosilane, tetraethylorthosilicate (TEOS), a siloxane, and an organosilane.

4. The method according to claim 1 wherein the silicon-containing gas is a metallic or a non-metallic hydride selected from the group consisting of silane, disilane, dichlorosilane, trichlorosilane, phosphine and diborane.

5. The method according to claim 1 wherein the step of supplying to the pump an oxidant for oxidising the silicon-containing gas within the pump and a liquid, comprises supplying the liquid to the pump separately from the oxidant.

6. The method according to claim 1 wherein the step of supplying to the pump an oxidant for oxidising the silicon-containing gas within the pump and a liquid, comprises supplying the liquid to the pump separately from the gas stream.

7. The method according to claim 1 wherein the step of supplying to the pump an oxidant for oxidising the silicon-containing gas within the pump and a liquid, comprises supplying the liquid intermittently to the pump.

8. The method according to claim 1 wherein the oxidant is selected from the group consisting of oxygen, ozone, a peroxide and a halogenated species.

9. A method of treating a gas stream containing a pyrophoric gas, the method comprising the steps of:
   conveying the gas stream to a pump;
   supplying to the pump an oxidant for oxidising the pyrophoric gas within the pump and a liquid; and
   exhausting from the pump said liquid containing a by-product of the oxidation of the pyrophoric gas,
   wherein the liquid comprises water or an aqueous solution.

10. The method according to claim 9 wherein the pyrophoric gas is a metallic or a non-metallic hydride selected from the group consisting of silane, disilane, dichlorosilane, trichlorosilane, phosphine and diborane.

11. The method according to claim 9 wherein the step of supplying to the pump an oxidant for oxidising the pyrophoric gas within the pump and a liquid, comprises supplying the liquid to the pump separately from the oxidant.

12. The method according to claim 9 wherein the step of supplying to the pump an oxidant for oxidising the pyrophoric gas within the pump and a liquid, comprises supplying the liquid to the pump separately from the gas stream.

13. The method according to claim 9 wherein the step of supplying to the pump an oxidant for oxidising the pyrophoric gas within the pump and a liquid, comprises supplying the liquid intermittently to the pump.

14. The method according to claim 9 wherein the oxidant is selected from the group consisting of oxygen, ozone, a peroxide and a halogenated species.

15. The method according to claim 14 further comprising the step of supplying oxygen to the pump within a stream of air or other oxygen-containing gas.

16. The method according to claim 9 wherein the step of conveying the gas stream to the pump comprising conveying the gas stream at a pressure in the range from 50 to 500 mbar.

17. The method according to claim 9 wherein the pump is a liquid ring pump, the liquid forming a liquid ring within the liquid ring pump.

18. The method according to claim 17 wherein the step of supplying to the pump an oxidant for oxidising the pyrophoric gas within the pump and a liquid comprises supplying the liquid to the pump at a level below that at which the liquid containing said by-product is exhaust from the pump.

19. The method according to claim 9 wherein the pump comprises intermeshing rotors.

20. The method according to claim 19 wherein the pump comprises a screw-type pumping mechanism.

21. Apparatus for treating a gas stream containing a silicon-containing gas, the apparatus comprising:
   a pump for receiving the gas stream;
   supply means connected to the pump for supplying an oxidant for oxidising the silicon-containing gas within the pump, and a liquid; and
   conveying means connected to the pump for conveying from the pump liquid containing a by-product of oxidation of the silicon-containing gas within the pump
   wherein the liquid comprises water or an aqueous solution.

22. The apparatus according to claim 21 wherein the pump comprises a first inlet for receiving the gas stream, and a second inlet for receiving the oxidant.

23. The apparatus according to claim 22 wherein the pump comprises a third inlet for receiving the liquid.

24. The apparatus according to claim 21 wherein the supply means comprises an oxidant supply means connected to the pump for supplying a gas stream comprising the oxidant.

25. The apparatus according to claim 24 wherein the gas stream comprises a stream having at least one of air, ozone, a peroxide or a halogenated species.

26. The apparatus according to claim 21 wherein the supply means comprises a water supply means connected to the pump for supplying a stream of water to the pump.

27. The apparatus according to claim 21 wherein the pump is a liquid ring pump.

28. The apparatus according to claim 21 wherein the pump comprises intermeshing rotors.

29. The apparatus according to claim 28 wherein the pump comprises a screw-type pumping mechanism.

30. A system for evacuating a process chamber, the system comprising:
   a vacuum pump for drawing a gas stream from the chamber; and
   apparatus according to claim 21 for receiving the gas stream from the vacuum pump.

31. The system according to claim 30 wherein the vacuum pump is configured to exhaust the gas stream at a pressure in the range from 50 to 500 mbar.

32. The system according to claim 30 comprising a purge gas supply means connected to the pump for supplying a purge gas to the vacuum pump.

33. The system according to claim 32 wherein the purge gas is nitrogen.

* * * * *